United States Patent
Elian et al.

(10) Patent No.: US 9,432,759 B2
(45) Date of Patent: Aug. 30, 2016

(54) SURFACE MOUNTABLE MICROPHONE PACKAGE, A MICROPHONE ARRANGEMENT, A MOBILE PHONE AND A METHOD FOR RECORDING MICROPHONE SIGNALS

(71) Applicant: Infineon Technologies AG, Neubiberg (DE)

(72) Inventors: Klaus Elian, Alteglofsheim (DE);
Horst Theuss, Wenzenbach (DE);
Thomas Mueller, Lappersdorf (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/065,067

(22) Filed: Oct. 28, 2013

(65) Prior Publication Data
US 2015/0023523 A1   Jan. 22, 2015

Related U.S. Application Data

(63) Continuation-in-part of application No. 13/947,930, filed on Jul. 22, 2013, now Pat. No. 9,332,330.

(51) Int. Cl.
*H04R 1/08* (2006.01)
*B81B 7/00* (2006.01)
*H04R 19/00* (2006.01)

(52) U.S. Cl.
CPC .......... *H04R 1/083* (2013.01); *B81B 7/0061* (2013.01); *B81B 2201/0257* (2013.01); *H01L 2224/95* (2013.01); *H01L 2924/14* (2013.01); *H01L 2924/1461* (2013.01); *H01L 2924/15* (2013.01); *H01L 2924/181* (2013.01); *H01L 2924/19106* (2013.01); *H04R 19/005* (2013.01); *H04R 2201/003* (2013.01); *H04R 2410/05* (2013.01)

(58) Field of Classification Search
CPC .............. H01L 294/00; H01L 2924/00014; H01L 2224/48091; H01L 2224/97; H01L 2294/00; H01L 2224/95; H01L 2924/19106; H01L 2924/181; H01L 2924/15; H01L 2924/1461; H01L 2924/14; H04R 1/083; H04R 2410/05; H04R 19/005; H04R 2201/003; B81B 7/0061; B81B 3/0024; B81B 2201/0257; B81B 3/0021
USPC ............ 483/50–51; 381/355, 361, 369, 174; 257/704, 724, 729, 416; 369/99
See application file for complete search history.

(56) References Cited

U.S. PATENT DOCUMENTS

| | | | |
|---|---|---|---|
| 5,970,159 A * | 10/1999 | McIntosh | 381/365 |
| 6,108,415 A | 8/2000 | Andrea | |
| 7,221,767 B2 * | 5/2007 | Mullenborn et al. | 381/174 |
| 7,233,679 B2 * | 6/2007 | Muthuswamy et al. | 381/369 |

(Continued)

OTHER PUBLICATIONS

Jung, E., et al., "Smart Sensor Systems—Packaging Technologies for Multi-Sensory Consumer Applications," Proceedings of the Sensor + Test Conference, D2.2, 2009, pp. 323-325.

*Primary Examiner* — Davetta W Goins
*Assistant Examiner* — Oyesola C Ojo
(74) *Attorney, Agent, or Firm* — Slater Matsil, LLP

(57) ABSTRACT

A surface mountable microphone package comprises a first microphone and a second microphone. Furthermore, the surface mountable microphone package comprises a first opening for the first microphone and a second opening for the second microphone. The first opening and the second opening are arranged on opposite sides of the surface mountable microphone package.

4 Claims, 10 Drawing Sheets

(56) References Cited

U.S. PATENT DOCUMENTS

| | | |
|---|---|---|
| 7,657,025 B2 | 2/2010 | Hsu et al. |
| 8,804,982 B2* | 8/2014 | Michel et al. ............... 381/111 |
| 2006/0140431 A1 | 6/2006 | Zurek |
| 2007/0047746 A1* | 3/2007 | Weigold et al. ............. 381/174 |
| 2008/0037768 A1* | 2/2008 | Hsu et al. .................... 379/429 |
| 2008/0157238 A1* | 7/2008 | Hsiao ........................... 257/416 |
| 2008/0217709 A1* | 9/2008 | Minervini ............ B81B 7/0061 257/416 |
| 2008/0318640 A1* | 12/2008 | Takano et al. ............. 455/569.1 |
| 2010/0303274 A1* | 12/2010 | Ryan et al. .................... 381/361 |
| 2012/0250897 A1* | 10/2012 | Michel ................... H04R 19/04 381/111 |
| 2012/0288130 A1* | 11/2012 | Dehe ............................ 381/353 |
| 2013/0156235 A1* | 6/2013 | Wickstrom ........... H04R 19/04 381/174 |

\* cited by examiner

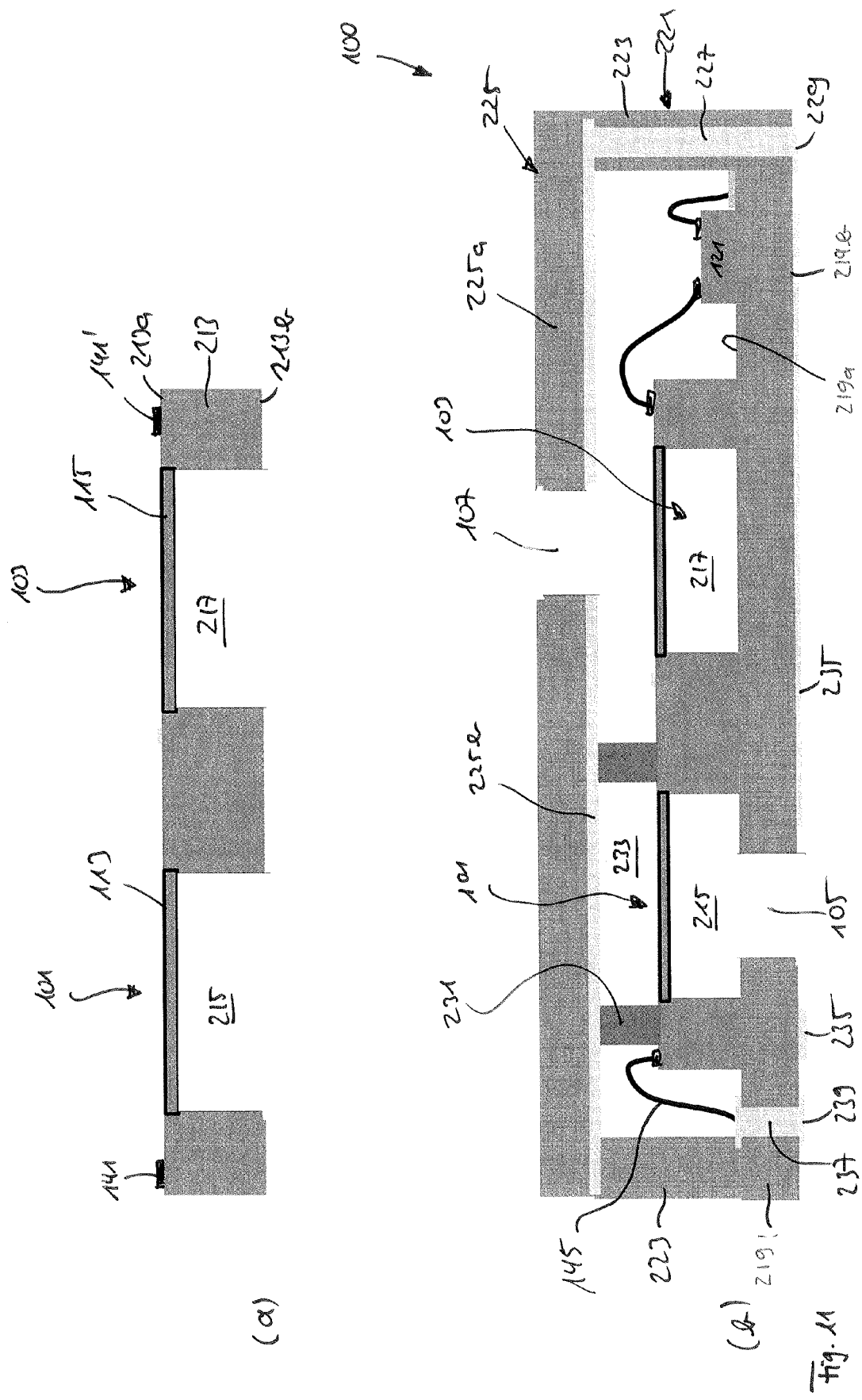

SURFACE MOUNTABLE MICROPHONE PACKAGE, A MICROPHONE ARRANGEMENT, A MOBILE PHONE AND A METHOD FOR RECORDING MICROPHONE SIGNALS This application is a continuation-in-part of U.S. application Ser. No. 13/947,930, which was filed on Jul. 22, 2013, and which is incorporated herein by reference.

TECHNICAL FIELD

In conventional smartphones or mobile phones two microphones are placed on different places on a circuit board of the mobile phone. Typically, one microphone is placed near the opening for speech and for recording a so-called use sound (like speech). Another microphone which is typically placed on the back side of the circuit board records the noise sounds behind the phone. Hence, the smartphone manufacturer has to assemble two different microphones on two different sides of a circuit board of a smartphone.

SUMMARY OF THE INVENTION

Embodiments of the present invention relate to a surface mountable microphone package. The surface mountable microphone package comprises a first microphone and a second microphone. Furthermore, the surface mountable microphone package comprises a first opening for the first microphone and a second opening for the second microphone. The first opening and the second opening are arranged on opposite sides of the surface mountable microphone package.

Further embodiments of the present invention relate to a microphone arrangement comprising a circuit board and an above described surface mountable microphone package, which is mounted on the circuit board. The circuit board comprises a hole which is arranged adjacent to the second opening of the surface mountable microphone package such that the hole and the second opening are fluidically connected.

Further embodiments of the present invention relate to a mobile phone comprising such a microphone arrangement.

Further embodiments of the present invention relate to a method for recording microphone signals.

BRIEF DESCRIPTION OF THE DRAWINGS

Embodiments of the present invention will be described in more detail, in which:

FIGS. 10a-10c show another embodiment of a microphone package in accordance with embodiments of the present invention, wherein FIG. 10(a) shows the package as a whole, and FIGS. 10(b) and (c) show the way of manufacturing such a package; and FIGS. 11a and 11b show another embodiment for a microphone package in accordance with which two microphones (membranes) are provided on the same chip, wherein FIG. 11(a) shows the microphone chip, and FIG. 11(b) shows the microphone package including the chip.

Before embodiments of the present invention are described in the following in more detail it is to be pointed out that in the figures the same or functionally equal elements are provided with the same reference numbers. Hence, descriptions provided for elements having the same reference numbers are mutually exchangeable.

DETAILED DESCRIPTION OF ILLUSTRATIVE EMBODIMENTS

Figure 1:
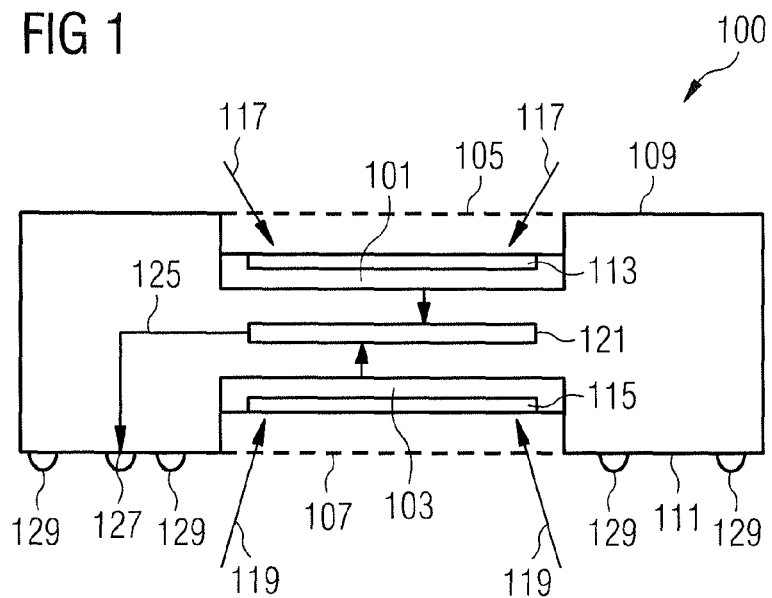
FIG. 1 shows a surface mountable microphone package according to an embodiment of the present invention.

FIG. 1 shows a block schematic diagram of a surface mountable microphone package 100 according to an embodiment of the present invention. The surface mountable microphone package 100 comprises a first microphone 101 and a second microphone 103. Furthermore, the surface mountable microphone package 100 comprises a first opening 105 for the first microphone 101 and a second opening 107 for the second microphone 103.

As can be seen from FIG. 1, the first opening 105 is arranged on a first side (e.g., a top side) 109 of the surface mountable microphone package 100 and the second opening 107 is arranged on a second side (e.g., a bottom side) 111 of the surface mountable microphone package 100. The first side 109 and the second side 111 are arranged opposite from each other or in other words are opposite sides of the surface mountable microphone package 100. As an example, the first side 109 can be a top side of the surface mountable microphone package 100 and the second side 111 can be a bottom side of the surface mountable microphone package 100.

It is advantageous that the two microphone units (the first microphone 101 and the second microphone 103) are arranged in a single surface mountable microphone package 100, because only one package may be placed on a circuit board instead of two different packages for the two microphones. Hence, the surface mountable microphone package 100 achieves on the one hand the recording of use signals (such as speech) and on the other hand the recording of noise signals within one single surface mountable microphone package 100. Furthermore, the footprint of the surface mountable microphone package 100 is typically smaller than the footprint of two single microphones placed on a circuit board. Hence, the surface mountable microphone package 100 also brings advantages regarding miniaturization.

Hence, it is an advantage of the surface mountable microphone package 100 that the first opening 105 (or the first sound inlet 105) and the second opening 107 (or the second sound inlet 107) are arranged on the opposing top side 109 and bottom side 111 of the surface mountable microphone package 100, as when mounting the surface mountable microphone package 100 on a circuit board, the manufacturer only has to provide a small sound hole in the board (which can be placed adjacent to the second opening 107) but still can detect sounds on both sides of the circuit board using only one single device (the surface mountable microphone package 100).

Further advantageous modifications of the surface mountable microphone package 100 will be described in the following.

As already described, typically it is sufficient to provide the first microphone 101 and the second microphone 103 in the surface mountable microphone package 100 as the combination of these two microphones 101, 103 enables the recording of both use sounds (such as speech) and noise sounds or background noise (which shall be filtered out of the use sounds). Hence, the surface mountable microphone package 100 may comprise only the two microphones 101, 103 and no further microphone.

Furthermore, the first microphone 101 and the second microphone 103 can be monolithically integrated.

According to further embodiments of the present invention the first microphone 101 may comprise a first single chip or die and the second microphone 103 may comprise a second single chip or die which are both arranged in the microphone package 100 (for example, opposing each other). Furthermore, the first chip and the second chip can be separated from each other (e.g., may comprise separate substrates). Hence, some embodiments provide a multiple die semiconductor microphone package 100.

Furthermore, the first microphone 101 can comprise a first diaphragm 113 which acts as the sound sensing element of the first microphone 101. Furthermore, the second microphone 103 can comprise a second diaphragm 115 which acts as the sound sensing element of the second microphone 103.

The first opening 105 is fluidically connected to the first diaphragm 113 of the first microphone 101 such that sound waves 117 (e.g., speech waves) entering the first opening 105 also hit the first diaphragm 113 and are recorded by the first microphone 101.

The second opening 107 is fluidically connected to the second diaphragm 115 of the second microphone 103 such that sound waves 119 (e.g., noise waves) entering the second opening 107 hit the second diaphragm 115 and are recorded by the second microphone 103.

Furthermore, the first opening 105 and the second opening 107 are fluidically separated from each other in the surface mountable microphone package 100. In other words, inside the surface mountable microphone package 100 there may be no fluidic connection between the first opening 105 and the second opening 107. Hence, it can be achieved that sound waves 107 which enter the first opening 105 (and which do not exceed a certain intensity threshold level) only hit the first diaphragm 113 and are only recorded by the first microphone 101 but not by the second microphone 103. Accordingly, it can be achieved that sound waves 119 which enter the second opening 107 (and which do not exceed a certain intensity threshold value) only hit the second diaphragm 115 and are only recorded by the second microphone 103 but not by the first microphone 101.

A main sound recording direction of the second microphone 103 is directed to the bottom side 111 of the surface mountable microphone package 100. In contrast to this, a main sound recording direction of the first microphone 101 is directed to the top side 109 of the surface mountable microphone package 100.

In other words, the first microphone 101 faces with its sensitive diaphragm 113 to the top side 109 of the surface mountable microphone package 100 and the second microphone 103 faces with its sound sensitive diaphragm 115 to the bottom side 111 of the surface mountable microphone package 100.

Furthermore, the first microphone 101 and the second microphone 103 can be semiconductor microphones and therefore the surface mountable microphone package 100 can also be a semiconductor surface mountable microphone package 100.

Furthermore, the surface mountable microphone package 100 can comprise a signal processing unit 121 which is connected to the first microphone 101 for receiving a first microphone output signal from the first microphone 101 and which is furthermore connected to the second microphone 103 for receiving a second microphone output signal from the second microphone 103.

The signal processing unit 121 may be implemented using a single chip or die but can also be implemented using a plurality of signal processing chips (for example, for each microphone 101, 103 a single signal processing chip).

The signal processing unit 121 can be configured to derive a difference signal 125 between the first microphone signal provided by the first microphone 101 and the second microphone signal provided by the second microphone 103. Furthermore, the signal processing unit 121 can be configured to provide the difference signal 125 as an output signal of the signal processing unit 100, for example, at an output terminal 127 of the surface mountable microphone package 100.

The difference signal 125 may be derived, for example, by subtracting the second microphone signal from the first microphone signal or by subtracting the first microphone signal from the second microphone signal. In general, it could be said that the difference signal 125 is derived by subtracting the microphone signal which comprises the noise sounds from the microphone signal which comprises the speech sounds, to filter out the noise sounds.

Hence, with the surface mountable microphone package 100 an integrated miniaturized semiconductor microphone can be realized, which can detect background noise and can even remove such background noise within a single surface mountable microphone package 100.

Hence, the difference signal 125 is the optimized use signal which is free of background noise or background sounds. Furthermore, the surface mountable package 100 can comprise on at least one of the sides 109/111 of the surface mountable microphone package 100 on which the first opening 105 and the second opening 107 are arranged an assembling terminal 129 for an assembly of the surface mountable microphone package 100 to a circuit board (such as a printed circuit board).

In the example shown in FIG. 1 four of such assembling terminals 129 are shown. Nevertheless, the number of such assembling terminals 129 can vary and may be chosen in dependence on the use case of the surface mountable microphone package 100. As an example, such assembling terminals 129 may be contact pads for being soldered to a circuit board and may have further the function of providing signals to the surface mountable package 100 or from the surface mountable package 100 to the circuit board. Furthermore, the output terminal 127 may also be such an assembling terminal at which also the difference signal 125 is provided.

Figure 2:
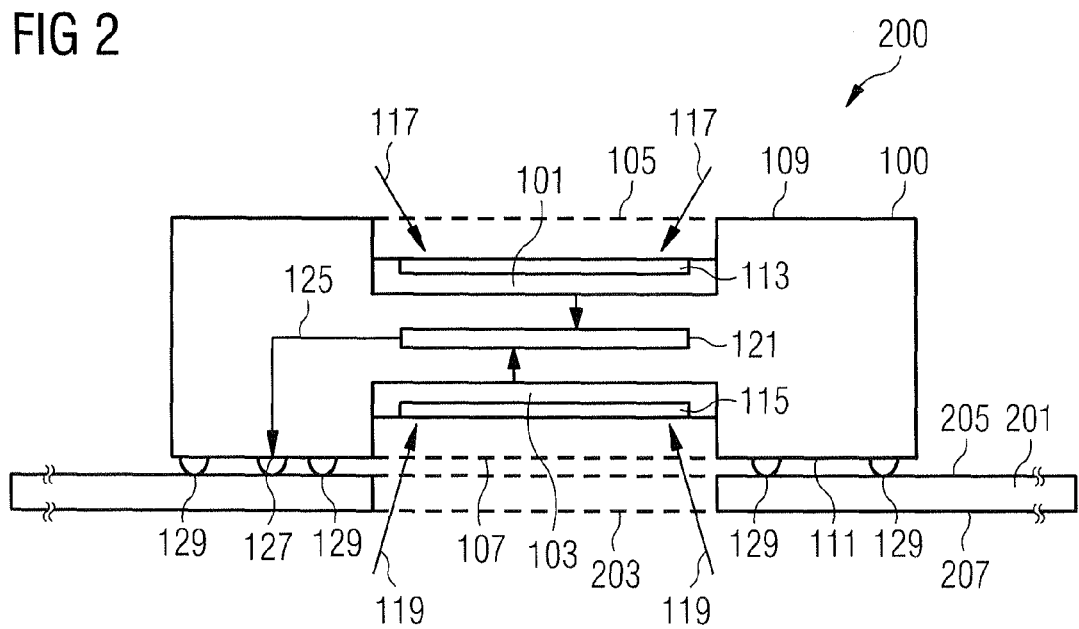
FIG. 2 shows a microphone arrangement comprising the surface mountable microphone package shown in FIG. 1 according to a further embodiment of the present invention.

FIG. 2 shows a microphone arrangement 200 according to a further embodiment of the present invention.

The microphone arrangement 200 comprises the surface mountable microphone package 100 shown in FIG. 1 and furthermore, a circuit board 201 (such as a printed circuit board 201). The surface mountable microphone package 100 is arranged on a top side 205 on the circuit board 201, for example, by soldering the surface mountable microphone package 100 using the assembling terminals 127, 129 to the circuit board 201.

As can be seen in FIG. 2, the circuit board 201 comprises a hole or opening 203 which is arranged adjacent to the second opening 107. Hence, the sound waves 119 which pass through the hole 203 of the circuit board 201 also pass through the second opening 107 and hit the second microphone 103. Hence, the hole 203 in the circuit board 201 and the second opening 107 are fluidically connected.

Furthermore, as can be seen from FIG. 2 the second opening 107 and the hole 203 aligned to each other in an overlapping manner. Hence, the sound waves 119 coming from a bottom side 207 of the circuit board 201 which is opposite to the top side 205 of the circuit board 201 can pass through the hole 203 and hit the second microphone 103 without any additional deflection. Sound waves 117 coming from the top side 205 onto which the surface mountable microphone package 100 is arranged directly pass through the first opening 105 and hit the first microphone 101.

Hence, as the sound openings 105, 107 are arranged on the top side 109 and the bottom side 111 of the package 100, it can be achieved that when using a typical surface mountable device assembly technique sounds from both sides of the circuit board 201 can be recorded without any problems and without any deflection of the noises.

The manufacturer may ensure that the circuit board 201 has the hole 203 which allows the sound waves 119 coming from the bottom side 207 of the circuit board 201 to pass through the hole 203 and hit the second microphone 103.

Figure 3:
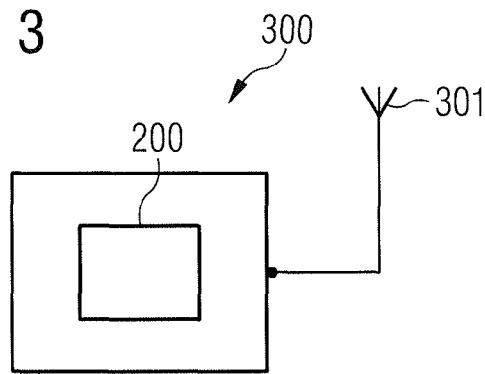
FIG. 3 shows a mobile phone according to an embodiment of the present invention.

Furthermore, FIG. 3 shows a mobile phone 300 according to a further embodiment of the present invention. The mobile phone 300 comprises the microphone arrangement 200 shown in FIG. 2 and an antenna 301. The antenna 301 may be configured to transmit signals (such as the difference signal 125) provided by the microphone arrangement 200.

By having the microphone arrangement 200 in the mobile phone 300 the cost of production 300 can be reduced when compared to two separate conventional packaged microphones disposed on a circuit board. It is sufficient for the microphone arrangement 200 to place one single surface mountable microphone package 100 on the circuit board 201 of the mobile phone 300. The microphone arrangement 200 still provides recordation of use signals (such as speech) and elimination of noise sounds like background noise.

Figure 4:
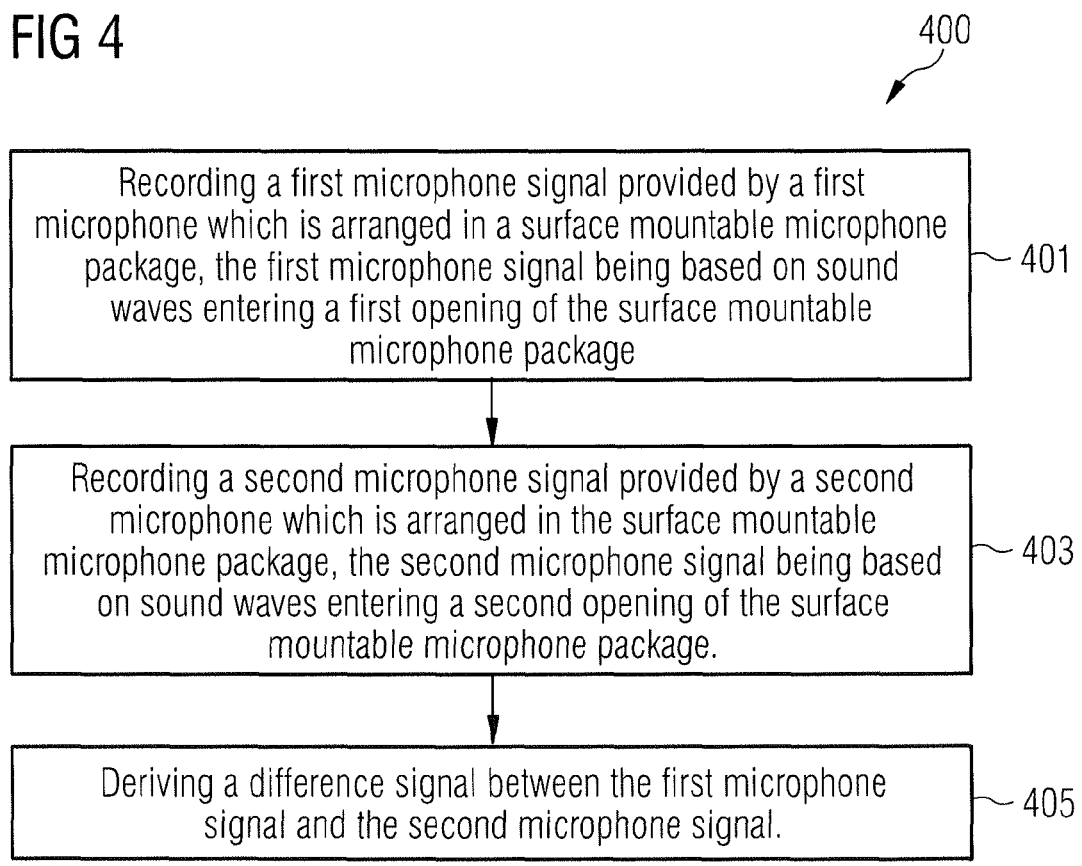
FIG. 4 shows a flow diagram of a method for recording microphone sounds according to a further embodiment of the present invention.

FIG. 4 shows a method 400 for recording microphone signals according to an embodiment of the present invention.

The method 400 comprises a step 401 of recording a first microphone signal provided by a first microphone (such as the first microphone 101) which is arranged in a surface mountable microphone package (such as the surface mountable microphone package 100). The first microphone signal is based on sound waves (such as the sound wave 117) entering a first opening (such as the first opening 105) of the surface mountable microphone package.

Furthermore, the method 400 comprises a second step 403 of recording a second microphone signal provided by a second microphone (such as the second microphone 103) arranged in the surface mountable microphone package. The second microphone signal is based on sound waves (such as the sound wave 119) entering a second opening (such as the second opening 107) of the surface mountable microphone package.

Furthermore, the first opening and the second opening are arranged on opposite sides (for example, on the sides 109 and 111) of the surface mountable microphone package.

The method 400 can be performed, for example, using the surface mountable microphone package 100.

Furthermore, the method 400 can comprise a step 405 of determining a difference signal (such as the difference signal 125) between the first microphone signal and the second microphone signal.

As an example, the difference signal is the optimized use signal which is free of background noises.

The method 400 may be supplemented by any of the features and functionalities described herein with respect to the apparatus, and may be implemented using the hardware components of the apparatus.

In the following further embodiments of the present invention will be described. Elements already been described with regard to FIGS. 1 and 2 and also shown in the subsequently described embodiments are referred to using the same reference signs also used in FIG. 1 or 2.

Figure 5:
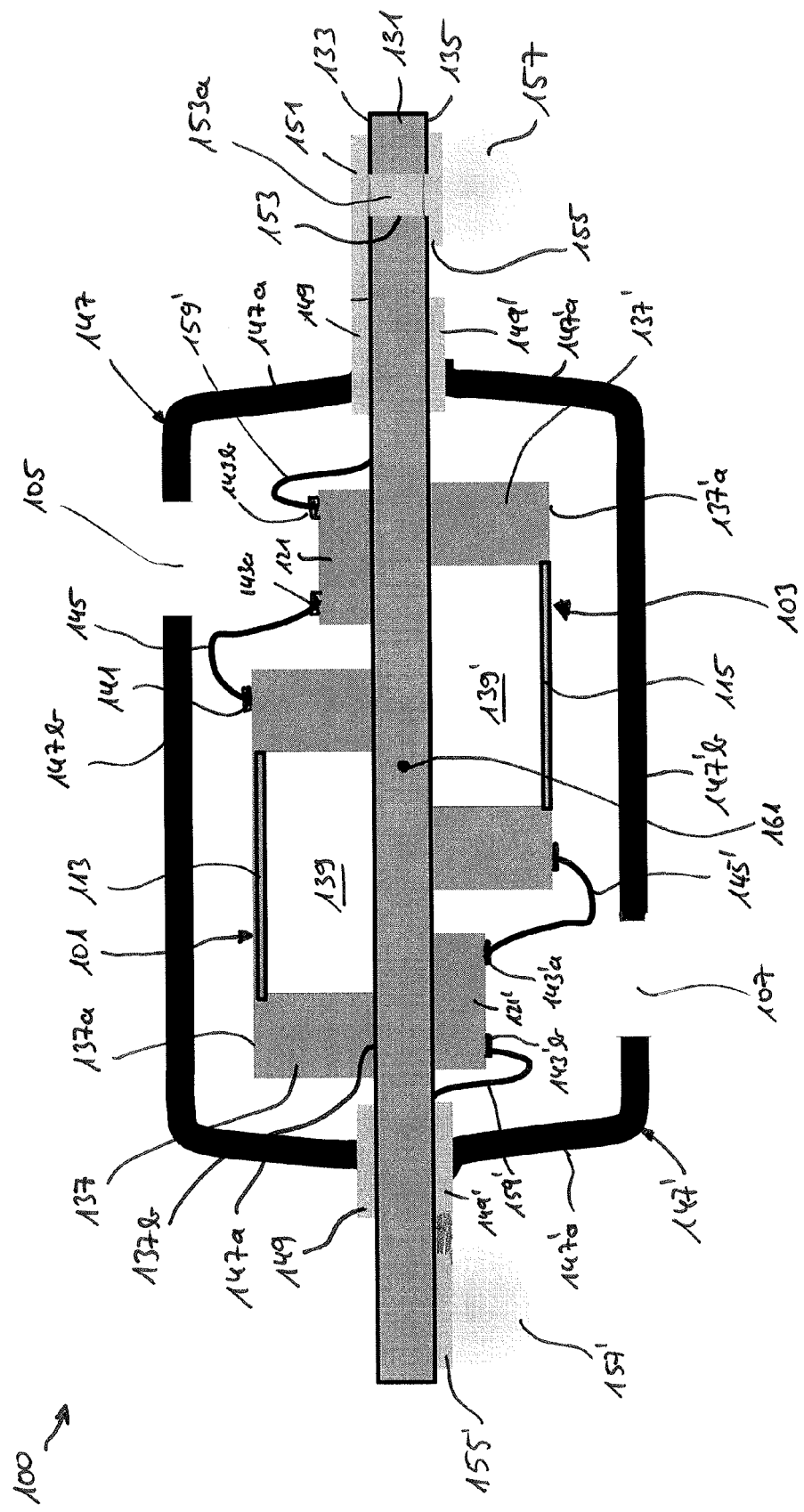
FIG. 5 shows an embodiment of a surface mountable microphone package having two acoustic ports.

FIG. 5 shows a surface mountable microphone package having two acoustic ports, one on the top and one on the bottom, in accordance with embodiments of the present invention. The surface mountable microphone package 100 comprises a chip carrier 131, for example, an organic multilayer substrate. The chip carrier 131 comprises a first or top surface 133 and a second or bottom surface 135, the top and bottom surfaces 133, 135 being opposed to each other, as is shown in FIG. 5. The first microphone 101 is arranged on the top surface 133 of the chip carrier and comprises a MEMS structure including a substrate 137 having a cavity 139 extending from a first surface 137a facing away from the chip carrier 131 to a second surface 137b adjacent to the chip carrier 131. In alternative embodiments, the cavity 139 may be formed in the substrate 137 in such a way that it only extends into the substrate 137 from the first surface 137a without reaching the second surface. The top portion of the cavity 139, i.e., the portion at the upper surface 137a of the substrate 137 is covered by the diaphragm 113. The first microphone 101 further comprises a contact pad 141 that is formed on the first surface 137a of the substrate or chip 137. The first microphone 101 in the embodiment of FIG. 5 may be formed by a MEMS die, for example, the microphone chip 137 including the membrane or diaphragm 113.

A first signal processing unit 121 is provided, for example, as a chip element that is mounted to the upper surface 133 of the chip carrier 131. The signal processing unit 121 may be an ASIC die, for example, a logic chip for signal conditioning. In accordance with embodiments, the ASIC 121 may be protected, e.g., it may be covered with a polymer material (not shown in the figure). The signal processing unit die 121 comprises two contact pads 143a, 143b formed on a surface of the die facing away from the chip carrier 131.

The MEMS die 101 forming the first microphone is connected to the ASIC die 121 via a bond wire 145 that is coupled between the contact pad 141 of the MEMS die 101 and the contact pad 143a of the ASIC die 121. The package 100 further comprises a cover 147 which may be a cover having a shielding function, for example, by providing the cover 147 as a metal lid or a non-conductive cover coated with a metal layer. The cover 147 is mounted to the upper surface 133 of the chip carrier 131 such that it houses the MEMS die 101 and the ASIC die 121. The cover 147 includes a substantially vertical part 147a extending substantially vertical or under a small angle away from the surface 133 of the chip carrier 131, and a substantially horizontal part 147*b* connected to the vertical part 147*a* and extending substantially parallel to the upper surface 133 of the chip carrier 131. In the embodiment of FIG. 5, the first opening 105 is formed in the horizontal part of the cover 147, more specifically in the example shown the acoustic signal port or first opening 105 is arranged at a position opposite to the mounting position of the ASIC die 121. However, other embodiments may provide the acoustic signal port 105 at other portions of the cover, for example, opposite to the MEMS die or in the vertical part 147*a* of the cover. Also, while the embodiment only shows a single acoustic port 105 embodiments may comprise two or more acoustic ports provided at different positions of the cover. In case of a cover having a shielding function, the cover 147 is mounted to the upper surface 133 of the chip carrier 131 with a conductive material 149, for example, a metal trace or like arranged there between. On the upper surface 133 of the chip carrier 131, in addition, a conductive trace 151 is provided extending from the conductor 149 away from the cover 147 towards a position of the chip carrier 131 where a through hole 153 is formed that is filled with a conductive material 153*a*. On the second or bottom side 135 of the chip carrier at the position of the through hole 153 a contact pad 155 is formed to which an electrical contact 157 may be applied, for example, a solder ball or the like. The second contact pad 143*b* of the ASIC die 121 is connected via a further bond wire 159 to a signal trace on the chip carrier 131 which, as mentioned above, may be a multilayer substrate so that the signal from the ASIC die 121 may be routed via the bond wire 159 and electric traces on and/or in the multilayer substrate to a position also outside the cover where, for example, the output terminal shown in FIG. 1 (see reference sign 127) is provided.

On the bottom surface 135 of the chip carrier 131 the surface mountable microphone package 100 comprises a structure that corresponds to the structure on the top surface 133. The arrangement of the elements on the top surface 133 and on the bottom surface 135 may be substantially point symmetrical with regard to point 161 shown in FIG. 5. The structure formed on the bottom surface 135 includes the second microphone 103 which may also be a MEMS die having the same structure as the MEMS die of the first microphone 101 and comprising the chip 137' in which the cavity 139' is formed that is covered by the diaphragm or membrane 115. Also a signal processing unit 121' is provided which may also be an ASIC die as described above. By means of the bond wire 145' the contact pad 141' of the MEMS die 137' is connected to the contact pad 143'*a* of the ASIC die 121'. The MEMS die 103 and the ASIC die 121' are also covered by a cover 147' in which the second opening or second acoustic signal port 107 is formed. The structure of the cover 147' and the arrangement and number of holes 107 may the same as described above with regard to the cover 147 provided on the first surface. The cover 147' is connected to the bottom surface 135 of the chip carrier 131 via a conductor 149' and at a position different from the position of the trace 151 on the second surface 135 a further trace 151' is provided which defines a contact pad to which a solder material 157' may be applied to provide for an electrical contact. In a similar way as described with regard to the arrangement on the first surface also on the second surface a contact pad 143'*b* of the ASIC die 121' is connected via a bond wire 159' to a signal trace formed on and/or inside the multilayer substrate 131 for providing the signal of the ASIC die 121' to an output terminal (not shown).

In the above described embodiment, the electrical interconnects have been shown as bond wires 145, 159, however, in accordance with other embodiments, the assembly may also be a flip-chip assembly, thereby avoiding the need for providing bond wires. Also, in the above example, two ASIC dies 121, 121' have been described as logic chips for signal processing or signal conditioning, however, in accordance with other embodiments a single ASIC die may be sufficient to handle the signals from both MEMS dies 101 and 103. Thus, either of ASIC dies 121 or 121' may be omitted and the MEMS die provided on the surface where no additional ASIC die is arranged may be contacted to the ASIC die on the other surface of the chip carrier by using signal traces provided in and/or on the chip carrier for connection to the ASIC die.

Figure 6:
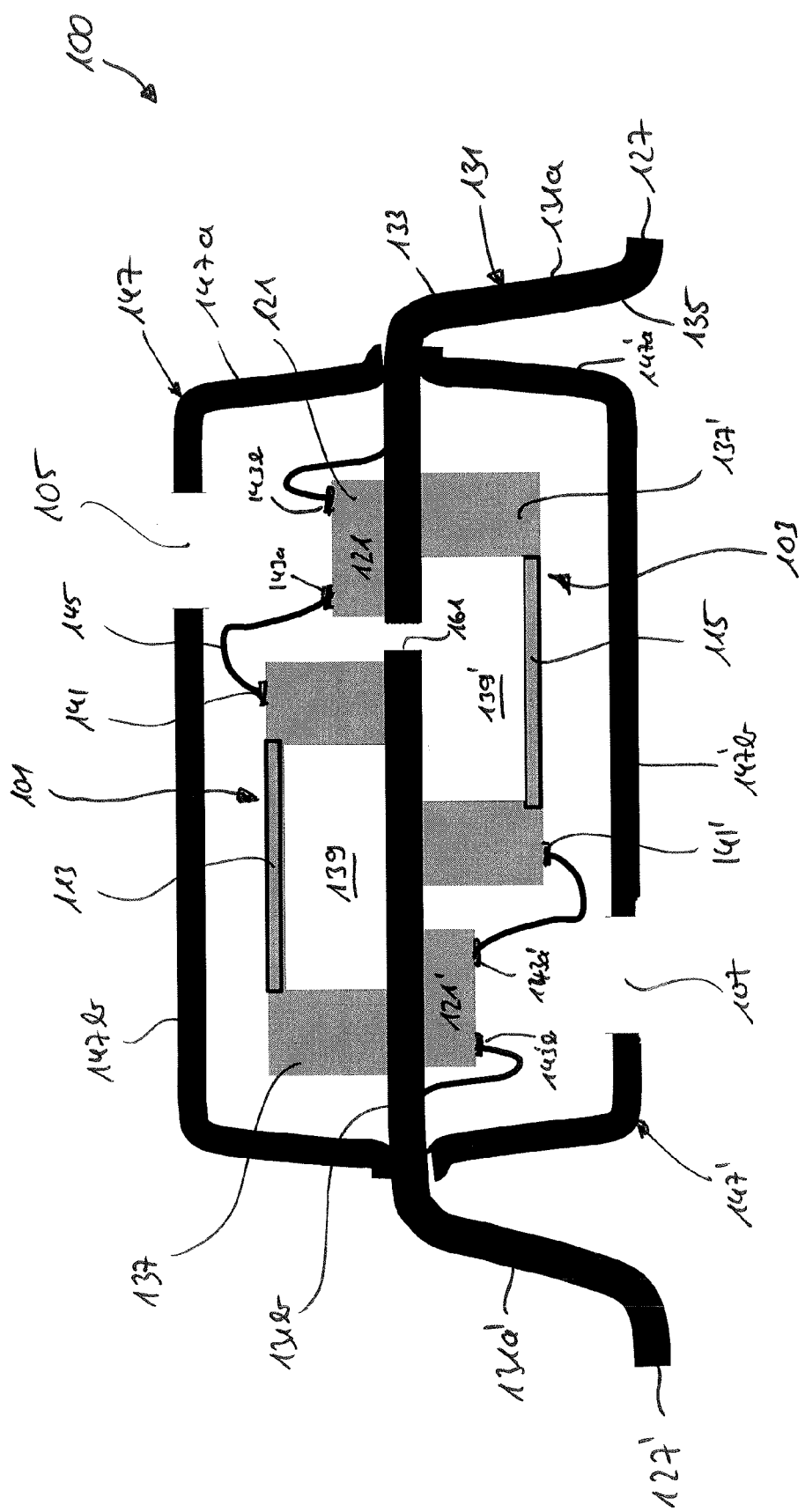
FIG. 6 shows another embodiment of a surface mountable microphone package having two acoustic ports on the top and on the bottom.

FIG. 6 shows another embodiment of a surface mountable microphone package having two acoustic ports on the top and on the bottom. The structure is similar to the one of FIG. 5 except that FIG. 6 shows an implementation of the package in accordance with which the chip carrier is formed by a lead frame. As can be seen from FIG. 6, the chip carrier 131 is formed by a lead frame having a plurality of lead connecting portions 131*a*, 131'*a* extending under an angle vertically downward from a substantially horizontal part 131*b* of the lead wire. On the upper surface 133 of the horizontal part 131*b* of the lead frame 131 the elements already described with regard to FIG. 5 are arranged, however, when compared to FIG. 5, due to the conductive nature of the lead frame 131, the cover 147 is directly attached to the horizontal part 131*b* of the lead frame at a position close to the connecting point of the horizontal and vertical parts. The top and bottom structures (with regard to the frame 131) may be the same as the ones described with regard to FIG. 5. When using two ASIC dies 121, 121', in addition it is necessary to provide for an insulation between the lead frame 131*a* on the right hand side forming the output terminal 127 for the signal output from the first ASIC 121 from the part of the lead frame including the portion 131'*a* forming the output terminal 127 for the output signal from the second ASIC 121. In accordance with the embodiment of FIG. 6, this is achieved by providing an opening 161 in the lead frame 131, thereby providing for the desired electrical isolation. In accordance with the embodiments, in case an opening from the top to the bottom is not desired, e.g., for avoiding acoustic energy at the signal port 105 to reach the second microphone 103, the opening 161 may be filled with an insulating material.

Figure 7:
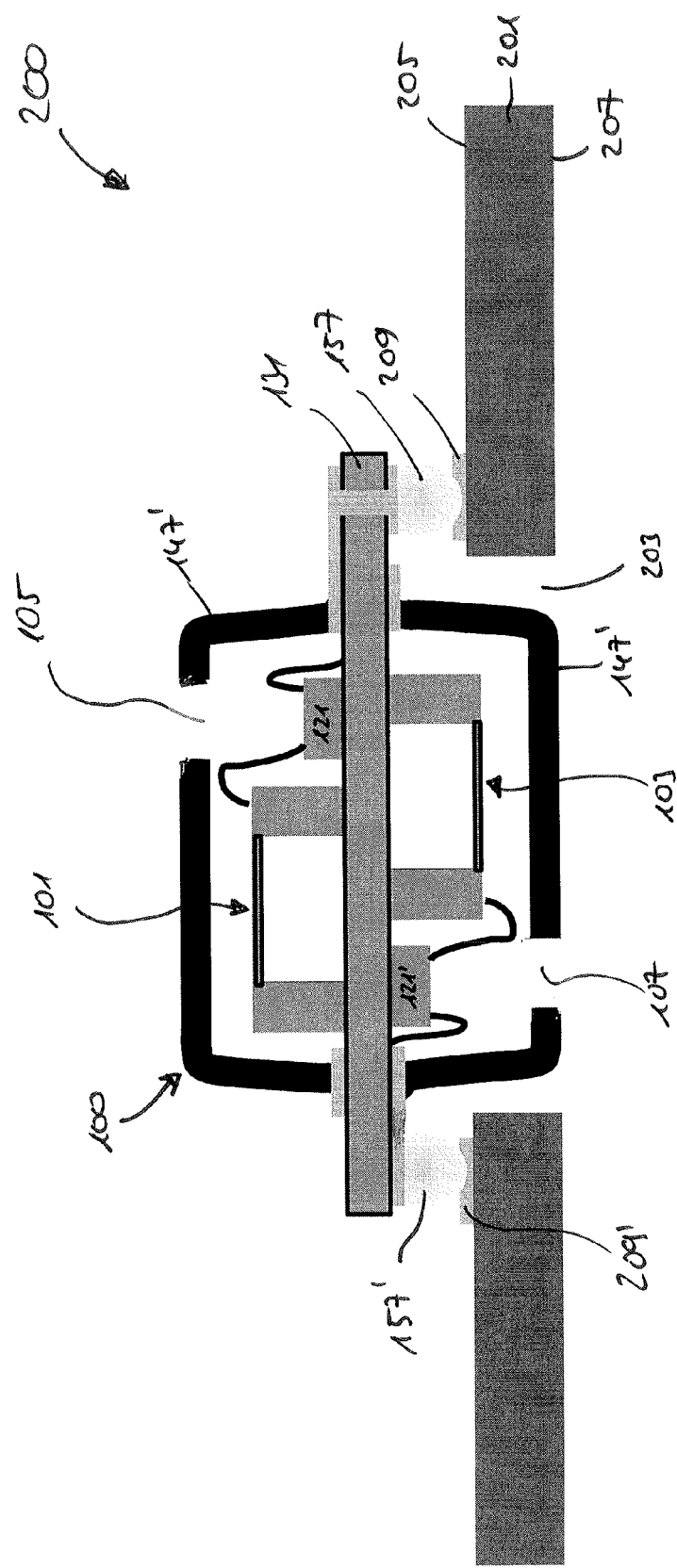
FIG. 7 shows the assembly of a package as it has been described with regard to FIG. 5 on a board.

FIG. 7 shows the assembly of a package as it has been described with regard to FIG. 5 on a board, like the printed circuit board 201 already described with regard to FIG. 2. In FIG. 7, the package 100 described in detail with regard to FIG. 5 is mounted to the board 201, for example, a printed circuit board which in turn may be part of an overall electronic device, like a cellular phone or a smartphone. The opening or hole 203 formed in the board 201 has a dimension such that it receives the lower part of the package 100 that is mounted via the contacts 157 and 157' to respective contact pads 209 and 209' formed on the top surface 205 of the board 201. The two acoustic ports 105 and 107, in view of the assembly as shown in FIG. 7, may be directed to the outside of the application, for example, to the front side and to the back side of the smartphone into which the board 201 is installed for noise reduction purposes as was described above. In accordance with embodiments, the respective ports 105, 107 may be sealed.

Figure 8:
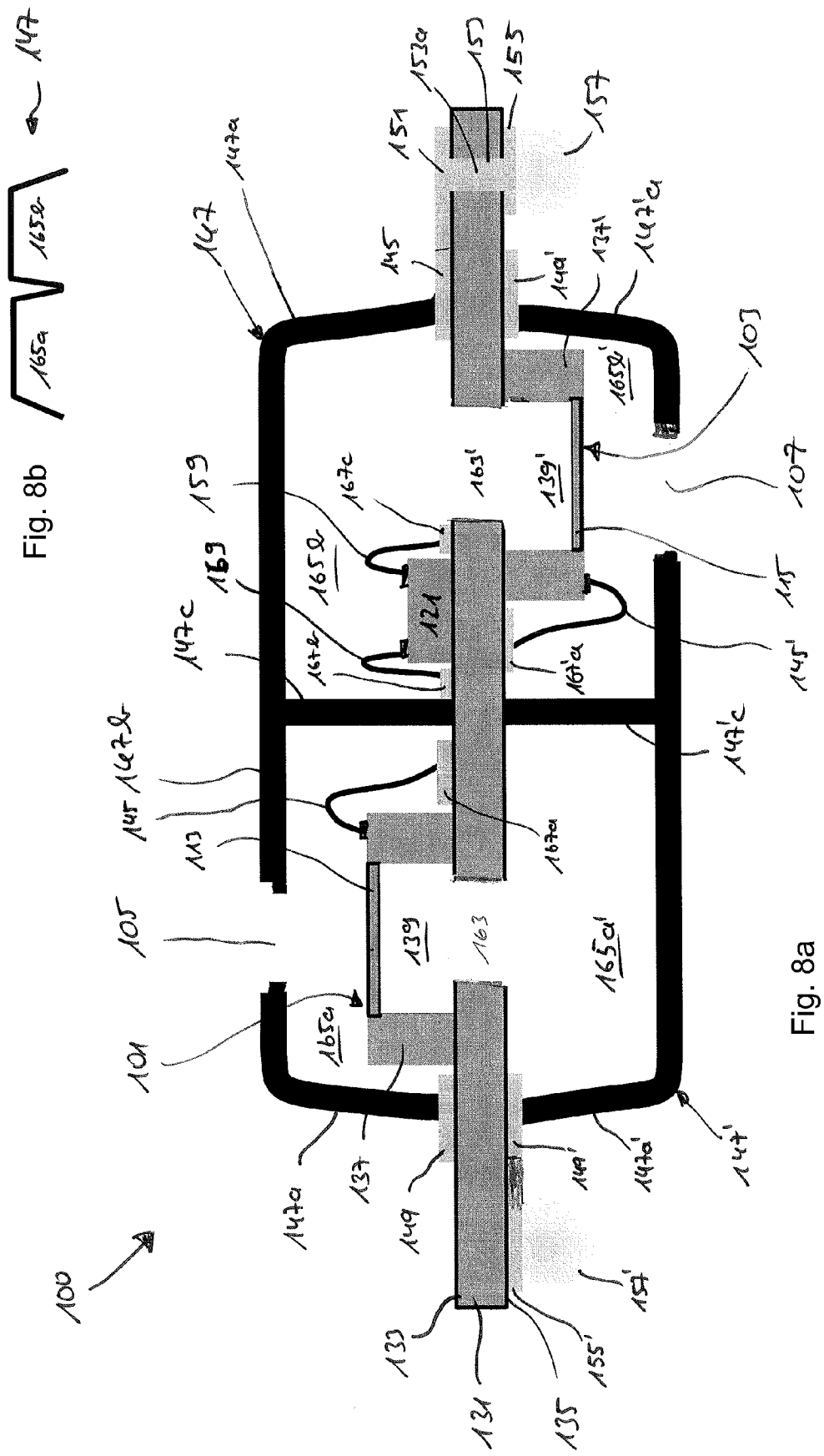
FIGS. 8a and 8b show another embodiment of a surface mountable microphone package having two acoustic ports at a top and at a bottom and providing a high back volume for the respective microphones.

FIG. 8*a* shows another embodiment of a surface mountable microphone package 100 having two acoustic ports at a top and at a bottom and providing a high back volume for the respective microphones, thereby improving the acoustic properties and the signals generated by the respective microphones. The elements shown in FIG. 8a are similar to the elements shown in FIGS. 5 and 6 and are therefore provided with the same reference signs. In the embodiment of FIG. 8a, for obtaining a high back volume for the respective microphones, the MEMS dies 137, 137', other than in the embodiments of FIGS. 5 and 6, are arranged non-overlapping. FIG. 8a also shows an example in accordance with which only a single ASIC die is used.

As is shown in FIG. 8a, the first microphone 101 is arranged on the upper surface 133 of the chip carrier 131, and the second microphone 103 is provided on the second or lower surface 135 of the chip carrier 131. As can be seen, the respective microphones 101 and 103 are arranged with an offset from each other such that they do not overlap. For providing each of the microphones 101 and 103 with an increased back volume, increased when compared to the embodiment of FIG. 5, the chip carrier 135 comprises an opening 163 extending from the first surface 133 to the second surface 135 of the chip carrier 131, thereby opening the cavity 139 of the MEMS die 137 of the first microphone 101 to the backside or second side 135 of the chip carrier. In a similar way, an opening 163' is formed in the chip carrier 131 providing for a connection from the cavity 139' of the MEMS die 137' to the front side 133 of the chip carrier 131. The package 100 also comprises the cover 147 that is similar to the one in FIGS. 5 and 6 except that it includes an intermediate, vertical part 147c separating the volume defined by the cover 147 and the carrier 131 into a first volume 165a and a second volume 165b. In a similar way, also the cover 147' mounted to the back side 135 of the chip carrier 131 comprises a vertical part 147'c separating the cavity defined by the cover 147' and the chip carrier 131 also in a first cavity 165'a and 165'b. The cavity 139 of the first microphone 101 communicates via the opening 163 with the cavity 165'a, and the cavity 139' of the second microphone 103 communicates via the opening 163' with the cavity 165b. Thus, for both microphones the back volume is increased when compared to the arrangement of FIGS. 5 and 6. In the embodiment of FIG. 8a, the first acoustic signal port 105 is arranged to be in communication with the cavity 165a, and the second acoustic signal port 107 is arranged to be in communication with the cavity 165'b.

As mentioned above, FIG. 8a shows an example of a package including only a single ASIC die 121 that, as is shown, is mounted on the top surface 133 of the carrier 131 and is arranged in the cavity 165b. It is noted that the ASIC die 121 may also be provided at another position inside the cavity 165b or it may be provided at another position in any of the other cavities defined by the respective covers 147, 147' and the chip carrier 131. In the embodiment depicted in FIG. 8a, the bond wire 145 connecting the first microphone 101 with the ASIC die 121 is connected to a contact pad 167a which in turn is connected further conductive traces on and/or in the chip carrier, which as mentioned above may be a multilayer substrate. In a similar way, the bond wire 145' of the second microphone 103 is connected to the contact pad 167'a, also being connected to the internal wiring of the multilayer substrate. A further contact pad 167c is provided on the upper surface 133 of the chip carrier 131 which is also in contact with the wiring of the chip carrier 131. By means of a bond wire 169 the contact pad 167c is connected to the basic die 121, and the ASIC die, by means of the bond wire, is connected to a further contact pad 167d, again connected to the wiring of the carrier 131 for providing the output signal from the ASIC die 121 to an output terminal of the package.

In the embodiment of FIG. 8a, the vertical part or vertical wall 147c separating the cavity defined by the covers and the circuit board 131 may be formed from a semiconductor material, like silicon, from a plastic material, like polymer, or from a metal material or any other suitable material. Alternatively, as is shown in FIG. 8b, also a specifically formed metal part may be used being formed basically of two covers connected to each other in a way as depicted in FIG. 8b.

The embodiment as described with regard to FIG. 8a may be mounted to a circuit board of a device in a way as has been described with regard to FIG. 7. Also, it is noted that instead of providing a substrate or a printed circuit board as a chip carrier, in a way similar as has been described with regard to FIG. 6, also a lead frame may be used.

Figure 9:
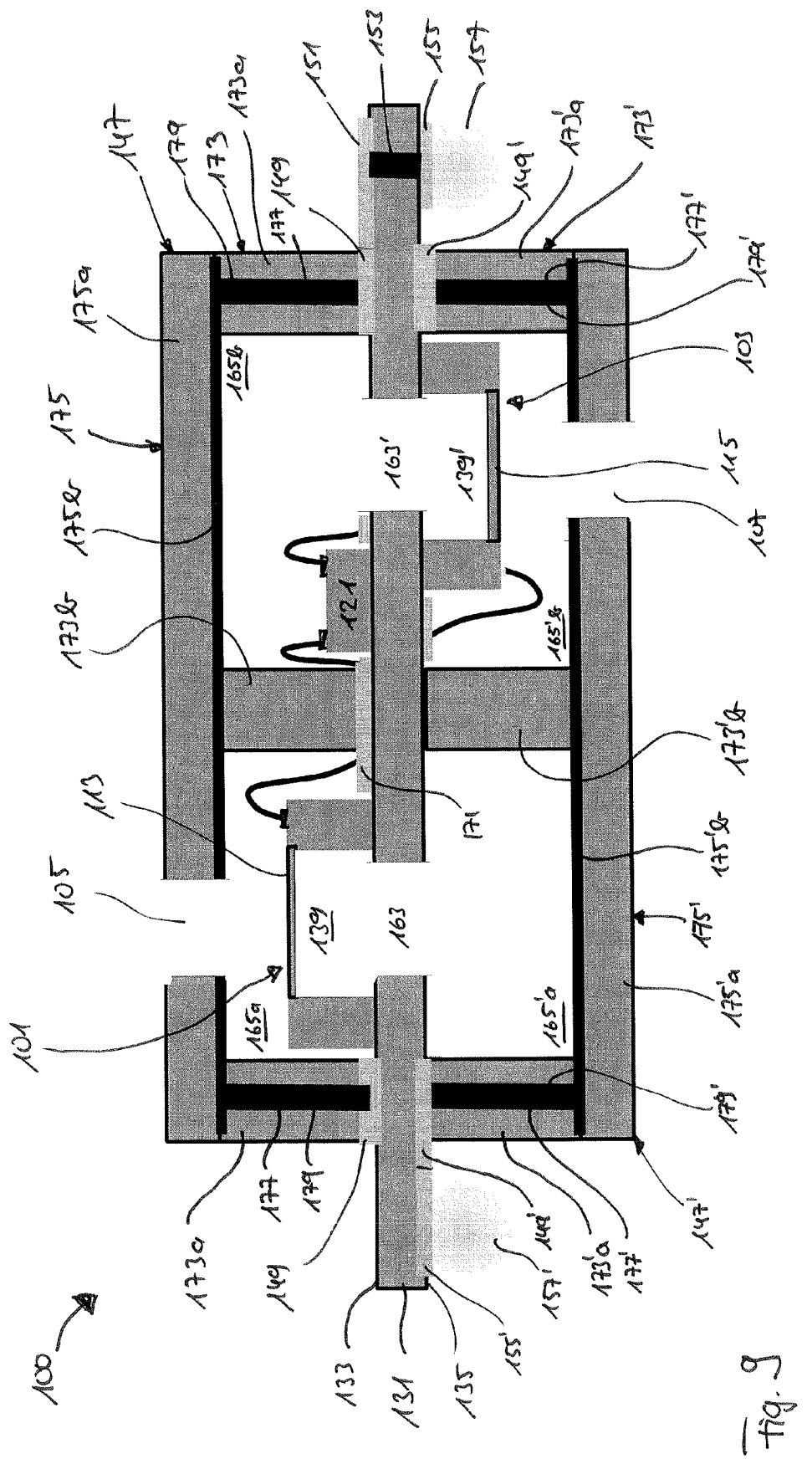
FIG. 9 shows another embodiment of the surface mountable microphone package having the covers formed in PCB technology.

FIG. 9 shows another embodiment of the surface mountable microphone package. The package shown in FIG. 9 is similar to the package of FIG. 8a, except that the respective covers are formed in PCB technology, e.g., a Cu-coated resin in PCB technology (PCB=printed circuit board). As can be seen from FIG. 9, when compared to FIG. 8a, the arrangement of the microphones 101, 103 and the arrangement of the ASIC die 121 are the same and also the wiring is basically the same except that the contact pads 167a and 167c have been combined so that the wiring from the first microphone 101 to the ASIC die 121 does not go through the wiring provided by the chip carrier 131 but is provided by the conductive trace 171. The cover 147 in accordance with the embodiment of FIG. 9 comprises a frame portion 173 and a cover portion 175, both of which may be formed from a printed circuit board. The frame portion 173 comprises outer or external wall portions 173a and an inner wall portion 173b extending from the upper surface 133 of the chip carrier 131. The chip carrier 131, the outer walls 173a and the cover portion 175 define the cavities 165a and 165b. The outer wall portions 173a include one or more through holes 177 filled with a conductive material 179. The through holes 177 extend from the lower surface of the outer wall portion 173a that is adjacent to the carrier 131 to an upper surface of the outer wall portion 173a so that, as is shown in FIG. 9, the lower end of the conductive material 179 contacts the contact pads 149. The cover portion 175 comprises a first layer 175a having on a surface thereof providing a conductive layer 175b. The cover portion 175 is mounted to the frame portion 173 in such a way that the conductive layer 175b faces the upper part of the frame portion so that when mounting the elements together the conductive layer 175b is in contact with the conductive material 179 formed in the outer wall portions 173a, thereby providing for the cover 147 having the desired shielding function. As can be seen, in the cover portion 175 the first acoustic signal part is provided. In a similar way as described above, also the cover 147' provided on the bottom surface 135 of the chip carrier 131 is formed.

Figure 10:
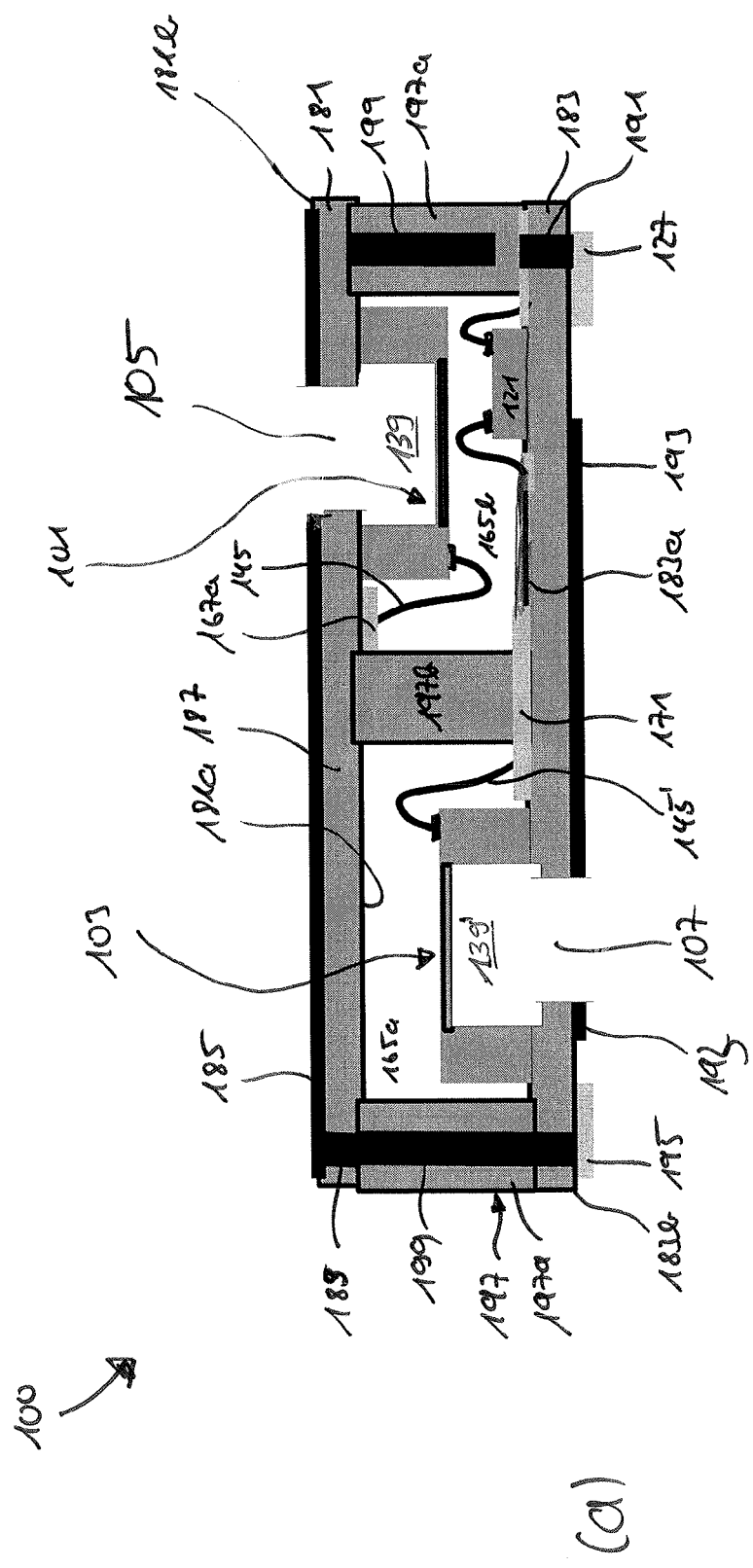
Figure 10:
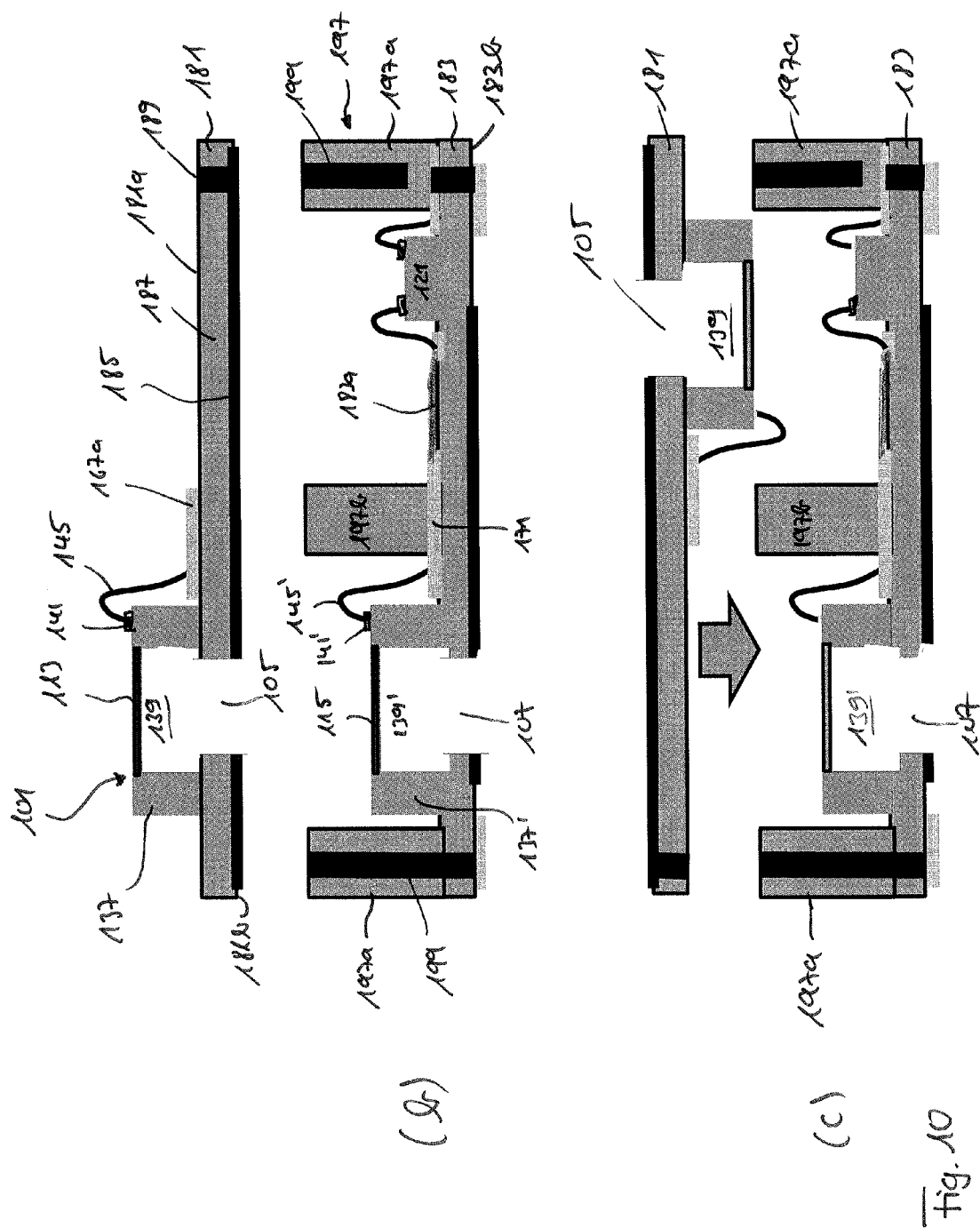

FIG. 10 shows another embodiment of a microphone package in accordance with embodiments of the present invention. FIG. 10(a) shows the package as a whole, and FIGS. 10(b) and (c) show the way of manufacturing such a package.

Other than in the embodiments described so far, no additional cover is needed in the approach of FIG. 10, rather the package 100 comprises a first substrate or carrier 181 to which the first microphone 101 is mounted, and a second substrate or carrier 183 to which the second microphone 103 and also a single ASIC die 121 used by both microphones is mounted. The microphone 101 is mounted to a first surface 181a of the carrier 181 and on a second surface 181b of the carrier 181 a conductive material 185 is applied. Further, in the carrier 181 a through hole 187 is formed that is filled by a conductive material 189 for providing a connection of the conductive layer 185 to the first surface 181a of the substrate or carrier 181. In addition, the first surface 181a of the substrate 181 comprises a contact pad 167a, and the contact pad 167 and the first microphone 101 are connected by the bond wire 145. On a first surface 183a of the chip carrier 183 the second microphone 103 is mounted as well as the ASIC die 121. The second microphone 121 is connected to the contact pad 171 via the bond wire 145' and the ASIC die 121 is connected to the contact pad 171 by means of the bond wire 169. The bond wire 159 is connected to the pad 167d that extends to a conductive through hole 191 filled with a conductive material and connecting the ASIC 121 to the output terminal 127 for providing the signals generated by the ASIC to an exterior circuitry. The second surface 183b of the chip carrier 183 is provided with a conductive material layer 193, and also the output terminal 127 and the contact pad 195 are formed on this surface. The first and second acoustic signal ports 105, 107 are formed in the first and second chip carriers 181, 183, respectively, in such a way that the cavities 139, 139' of the respective microphones 101, 103 communicate with the exterior. The microphone shown in FIG. 10 further comprises a frame structure 197 (e.g., formed by a printed circuit board) including outer walls 197a and an inner wall 197b. The two substrates or carriers 181, 183 are mounted to the two surfaces of the frame structure 197, thereby defining the separated chambers 165a and 165b. For providing a shielding in the cover, the outer walls 197a of the frame structure 197 are provided with through holes 199 filled with a conductive material. Through hole connects the contact pad 195 to the through hole 187 in the upper carrier 181. The embodiment of FIG. 10 provides a microphone having two separate microphones with a high back volume while avoiding the need for a separate carrier and a separate cover which also allows for an improved assembly process as is described in the following with regard to FIGS. 10(b) and 10(c).

As can be seen from FIG. 10(b), in a first step the first carrier 181 is provided with the conductive layer 185, the acoustic signal port 105 and also the first microphone 101 is mounted to the carrier. In a similar way, the second carrier 182 is formed and the frame 197 is applied thereto. Following this preparation, the processed first carrier 181 is flipped over and mounted to the remaining structure in a way as shown in FIG. 10(c). It is noted that the wiring of the first microphone may be provided by an internal wiring structure provided in the center wall 197 of the frame portion towards the lower substrate 183 having further wiring (not shown) for connection to the ASIC die 121.

FIG. 11 shows another embodiment for a microphone package in accordance with which two microphones (membranes) are provided on the same chip or die. FIG. 11(a) shows the microphone chip 213 that is provided with two cavities 215 and 217 extending from an upper surface 213a to a lower surface 213b of the chip 213. The first cavity 215 is covered at the upper surface 213a by the diaphragm 113, and the second cavity 217 is covered at the upper surface 213a by the diaphragm 115, thereby defining the first and second microphones 101, 103. For each of the microphones 101, 103 the respective contact pads 141 and 141' are provided on the first surface 213a of the chip.

The chip shown in FIG. 11(a) is used for forming a microphone package 100 as it is shown in FIG. 11(b). The package 100 comprises a chip carrier 219 on a first surface 219a of which the microphone chip 213 is mounted. Also, on this surface a single ASIC die 121 is mounted. The chip carrier 219 comprises an opening defining the first acoustic signal port 105 for connecting the exterior of the device and the cavity 215 of the first microphone 101. A frame structure 221 (e.g., formed from a PCB) is mounted to the first surface 219a of the chip carrier 219, the frame structure having outer vertical walls 223, on top of which a cover 225 is arranged. The cover 225 comprises a first layer 225a and a conductive layer 225b and the cover is mounted such that the conductive layer 225b faces the surface 219a of the chip carrier 219. Further, a through hole 227 filled with a conductive material and extending through the vertical wall 223 and through the chip carrier 219 connects the conductive layer 225b to a contact pad 229 formed on the lower surface 219b of the chip carrier 219. In an area opposite to the second microphone 103 the second acoustic signal port 107 is formed by an opening extending through the cover for communicating the interior of the package with the environment. In addition, a further frame structure 231 is provided around the membrane 113 of the first microphone 101 for defining the further cavity 233 formed by the frame 231, the cover portion 225 and the diaphragm 113. The frame may be formed by bonding a structured wafer or another grid made of metal, plastic or semiconductor material or any other suitable material. Also, the frame may be created by structuring a photoresin. The cavity forms a back volume and in noise reduction applications it might be beneficial to have the back volume to be comparable to the back volume for the second microphone which, in the embodiment shown in FIG. 11, is defined by the cavity 217. On the second surface 219b of the chip carrier 219 also a conductive layer 235 is formed, thereby providing the desired shielding function of the housing of the microphones. As can be seen from FIG. 11, in this embodiment the first microphone 101, by means of the bond wire 145, is connected to a through hole 237 filled with a conductive material 239 extending to a contact pad 239 so that, in this embodiment, the wiring of the signals from the first microphone to the ASIC 121 will be done externally, for example, via the printed board to which the package is mounted. Alternatively, the signals may be processed by an external processing unit.

With regard to FIG. 11 it is noted that in alternative embodiments the frame structure 231 can be omitted and replaced by a wall structure dividing the interior of the package 100 into two separate chambers, one associated with a first microphone 101 and the other associated with the second microphone 103.

With regard to the above referenced embodiments, it is noted that while FIGS. 5 to 11 show embodiments each including one or more ASIC dies, the inventive approach is not limited to such arrangements. Rather, the microphones may also be realized without the ASIC dies and the signals from the microphones are simply provided to an external signal processing unit that may be provided on the circuit board to which the microphone package is mounted.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method steps may be executed by (or using) a hardware apparatus, like for example, a microprocessor, a programmable computer or an electronic circuit. In some embodiments, some one or more of the most important method steps may be executed by such an apparatus.

Depending on certain implementation requirements, embodiments of the invention can be implemented in hardware or in software. The implementation can be performed using a digital storage medium, for example, a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may, for example, be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein. The data carrier, the digital storage medium or the recorded medium are typically tangible and/or non-transitionary.

A further embodiment of the inventive method is, therefore, a data stream or a sequence of signals representing the computer program for performing one of the methods described herein. The data stream or the sequence of signals may, for example, be configured to be transferred via a data communication connection, for example, via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example, a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

Although each claim only refers back to one single claim, the disclosure also covers any conceivable combination of claims.

What is claimed is:

1. A surface mountable microphone package comprising:
   a first microphone;
   a second microphone;
   a first opening configured to receive sound waves to be recorded by the first microphone;
   a second opening configured to receive sound waves to be recorded by the second microphone, the second opening being separate from the first opening;
   a carrier, wherein the first microphone is mounted to a first surface of the carrier, and wherein the second microphone is mounted to a second surface of the carrier, the first and second surfaces being opposite to each other;
   a first cover arranged on the first surface of the carrier and defining a first cavity housing for the first microphone, wherein the first opening is formed in the first cover; and
   a second cover mounted to the second surface of the carrier and defining a second cavity housing for the second microphone, the second opening being formed in the second cover,
   wherein the first and second microphones are arranged in a non-overlapping manner, wherein the first cavity is separated into a first chamber and into a second chamber, wherein the second cavity is separated into a third chamber and a fourth chamber, wherein the first microphone is arranged in the first chamber and in communication with the third chamber via an opening in the carrier, and wherein the second microphone is arranged in the fourth chamber and in communication with the second chamber via a further opening in the carrier.

2. The surface mountable microphone package of claim 1, wherein the carrier comprises at least one of a substrate or a lead frame.

3. The surface mountable microphone package of claim 1, wherein the first and second covers comprise at least one of a metal lid, a metal-coated resin, or a PCB structure including a frame portion and a cover portion.

4. A mobile phone comprising:
   the surface mountable microphone package according to claim 1; and
   an antenna.

* * * * *